United States Patent [19]

Swafford et al.

[11] Patent Number: 5,428,314
[45] Date of Patent: Jun. 27, 1995

[54] ODD/EVEN ORDER DISTORTION GENERATOR AND DISTORTION CANCELLATION CIRCUIT

[75] Inventors: William Swafford, Carlsbad; Todd Van Cleave, San Marcos, both of Calif.

[73] Assignee: Tacan Corporation, Carlsbad, Calif.

[21] Appl. No.: 239,466

[22] Filed: May 9, 1994

[51] Int. Cl.⁶ ............................................. H03F 1/32
[52] U.S. Cl. .................................. 330/149; 327/317; 327/551
[58] Field of Search ....................... 330/149; 328/163; 332/160; 375/60; 455/50.1

[56] References Cited

U.S. PATENT DOCUMENTS

| | | | |
|---|---|---|---|
| 4,870,371 | 9/1989 | Gottwald et al. | 328/163 X |
| 4,992,754 | 2/1991 | Blauvelt et al. | |
| 5,077,619 | 12/1991 | Toms | |
| 5,132,639 | 7/1992 | Blauvelt et al. | |
| 5,161,044 | 11/1992 | Nazarathy et al. | |
| 5,227,736 | 7/1993 | Tucker et al. | 330/149 |

FOREIGN PATENT DOCUMENTS

19305  1/1985  Japan ................................. 330/149

OTHER PUBLICATIONS

Childs & O/Byrne, "Multichannel AM Video Transmission Using a High-Power Nd:YAG Laser and Linearized External Modulator," IEEE Journal on Selected Areas in Communications, vol. 8, No. 7, Sep. 1990.

*Primary Examiner*—James B. Mullins
*Attorney, Agent, or Firm*—Brown, Martin, Haller & McClain

[57] ABSTRACT

An input signal is split into two signals, one of which is provided to a distortion generator and a the other of which is provided to a three-way combiner. The distortion generator comprises a single composite amplifier stage having two nonlinear amplifiers and two 180 degree splitters. The amplifiers produce signals having both odd and even-order distortion components because the amplifiers exhibit non-linear behavior. The distortion generator produces two output signals, one of which consists of the fundamental signal and odd-order distortion components, and the other of which consists only of even-order distortion components. The three-way combiner combines these two signals with a portion of input signal at a phasing that produces a resultant output having both the odd and even-order distortions suppressed. Equalizers may be used to provide phase and/or amplitude compensation for the two signals produced by the distortion generator before providing them to the three-way combiner.

6 Claims, 3 Drawing Sheets

ODD/EVEN ORDER DISTORTION GENERATOR AND DISTORTION CANCELLATION CIRCUIT

BACKGROUND OF THE INVENTION

The present invention relates generally to systems for cancelling distortion caused by nonlinearities in the transfer functions of electronic devices by generating complementary distortions and, more specifically, to a system for cancelling both odd and even order distortions by generating complementary odd and even order distortions.

The nonlinearities inherent in many opto-electronic devices produces distortion in optical communication systems. Linearization circuits known in the art combine the device signal with a signal that is equal in magnitude but opposite in sign, such that distortion is canceled. In U.S. Pat. No. 5,227,736, issued to Tucker et al. a linearization circuit cancels second-order nonlinearities. Two 180 degree hybrids and two linear amplifiers are used to generate distortion. The isolated port of the second hybrid produces the distortion signal. The other output of the second hybrid produces a signal that includes the fundamental signal. The amplifiers must be linear to avoid generating excessive odd-order distortion along with the fundamental signal.

In U.S. Pat. No. 4,992,754, issued to Blauvelt et al. a portion of the main signal is split off into a distortion generator that produces second-order distortions. These distortions are adjusted in phase and amplitude and recombined with the main path signal. A time delay is included in the main signal path to equalize delays in the paths. The composite signal is then fed to the device to be linearized.

In U.S. Pat. No. 5,132,639, issued to Blauvelt et al., two portions of the main signal are split off into two distortion generators. One distortion generator generates second-order distortions in response to the portion of the main signal it receives. The other distortion generator generates third-order distortions in response to the portion of the main signal it receives. These distortions are adjusted in phase and amplitude and recombined with the main path signal. A three-way directional coupler combines the signal of the main path with those of the two distortion generator paths. A time delay is included in the main signal path to equalize delays in the paths. Although this device cancels second and third-order distortions, it uses two distortion generators.

It would be desirable to cancel both odd and even-order distortions using a distortion generator having only a single section. Such a device would be more economical to produce and maintain than those known in the art because the part count and complexity would be reduced. These problems and deficiencies are clearly felt in the art and are solved by the present invention in the manner described below.

SUMMARY OF THE INVENTION

The present invention is a circuit comprising a distortion generator and a three-way power combiner. Both the distortion generator and the combiner receive a portion of an input signal. The distortion generator comprises a single composite amplifier stage having two nonlinear amplifiers and two 180 degree splitters. The amplifiers must be nonlinear to produce signals having both odd and even-order distortion components. The distortion generator produces two output signals, one of which consists of the fundamental signal and odd-order distortion components, and the other of which consists only of even-order distortion components. The combiner receives these two signals and the input signal and combines them at a phasing that produces a resultant output having both the odd and even-order distortions suppressed. The present invention may be used with any nonlinear electronic device,, such as an RF/microwave amplifier, directly modulated laser, light-emitting diode, or optical modulator, to cancel the distortion caused by the nonlinearity. The present invention should be connected in series with the electronic device to be linearized.

The present invention may also include means for providing phase and/or amplitude compensation for the two signals produced by the distortion generator. Such compensation minimizes the effects of any differences between frequency-dependent non-linearity characteristics of the distortion generator and frequency-dependent non-linearity characteristics of the device to be linearized.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF A PREFERRED EMBODIMENT

Figure 1A:
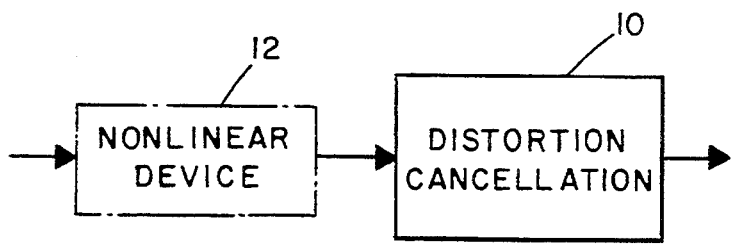
FIGS. 1a–b are diagrammatic illustrations of the manner in which the present invention may be connected to an electronic device for cancelling distortion caused by non-linearities in the device.
Figure 1B:
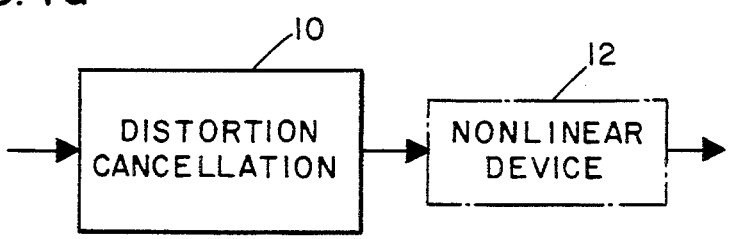

As illustrated in FIGS. 1a–b, an odd/even distortion cancellation circuit 10 may be connected in series with any suitable nonlinear electronic device 12, such as a RF/microwave amplifier, directly modulated laser, light emitting diode, or optical modulator. As illustrated in FIG. 1a, odd/even distortion cancellation circuit 10 may be connected to receive the output of nonlinear device 12 or, equivalently, odd/even distortion cancellation circuit 10 may be connected to provide an input to device 12, as illustrated in FIG. 1b.

Figure 2:
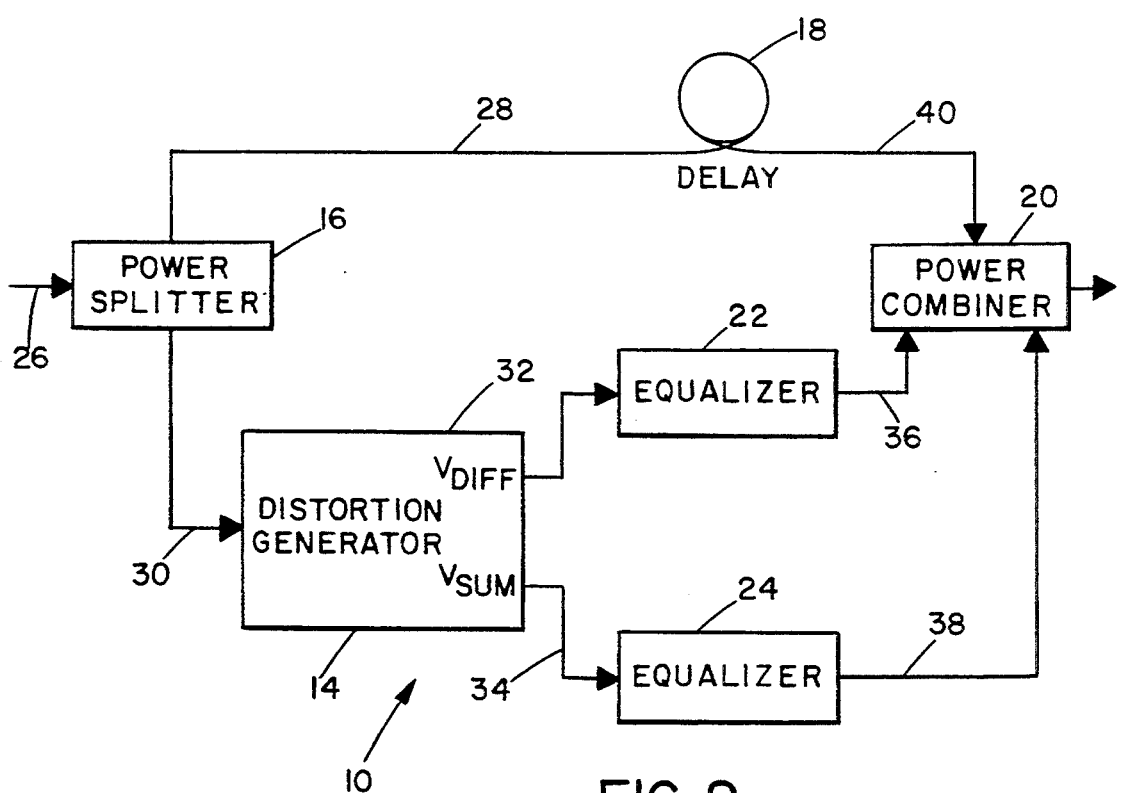
FIG. 2 is a diagrammatic illustration of a distortion cancellation circuit that includes an odd/even-order distortion generator.

As illustrated in FIG. 2, odd/even distortion cancellation circuit 10 comprises a distortion generator 14, which is described in further detail below, a splitter 16, a delay line 18, a three-way combiner 20, and two equalizers 22 and 24. Splitter 16 may be either an even-split power splitter/combiner or a directional coupler.

Splitter 16 receives an input signal 26 and splits it into a split fundamental signal 28 ($V_f$) and a split input signal 30 ($V_i$) having the same phase. However, the relative amplitudes of signals 28 and 30 will differ depending on several factors, including the magnitude of input signal 26, the characteristics of device 12, and the characteristics of distortion generator 14. Distortion generator 14 receives signal 30 and in response produces a first distortion signal 32 ($V_{DIFF}$) and a second distortion signal 34 ($V_{SUM}$). As described below with respect to FIG. 3, first distortion signal 32 consists of the fundamental component and odd-order distortion components of signal 26, and second distortion signal 34 consists only of even-order distortion components of signal 26.

Equalizers 22 and 24 provide compensation for differences in frequency-dependent nonlinearity characteristics between device 12 and distortion generator 14. Equalizers 22 and 24 produce a first equalized distortion signal 36 and a second equalized distortion signal 38, respectively. An operator may adjust the phase and/or amplitude of signals 32 and 34 across a predetermined frequency band of interest. Delay line 18 delays signal 28 to produce a delayed signal 40. Three-way combiner 20 receives delayed signal 40 and equalized distortion signals 36 and 38 and combines them in a manner described in further detail below.

Figure 3:
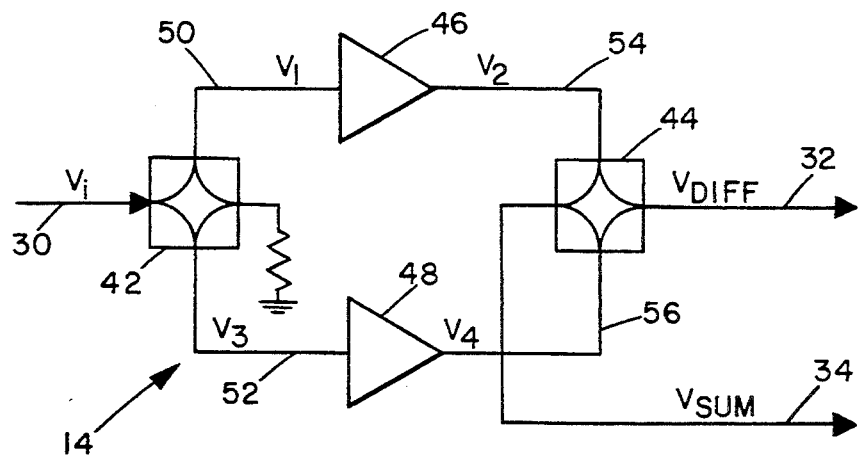
FIG. 3 is a diagrammatic illustration of an embodiment of the odd/even-order distortion generator.

As illustrated in FIG. 3, one embodiment of odd-/even distortion generator 14 may comprise two 180 degree hybrid splitter/combiners 42 and 44 and two non-linear amplifiers 46 and 48. Hybrid 42 receives split input signal 30 ($V_i$) and splits it into a first split signal 50 ($V_1$) and a second split signal 52 ($V_3$). Signals 50 and 52 have the same amplitude but differ in phase by 180 degrees. Amplifier 46 receives split signal 50, and amplifier 48 receives split signal 52. Amplifier 46 produces a first amplified signal 54 ($V_2$), and amplifier 48 produces a second amplified signal 56 ($V_4$). Signals 54 and 56 consist of the amplified fundamental signals and both even and odd-order distortion components, which are caused by the nonlinearities inherent in amplifiers 46 and 48. Hybrid 44 receives signals 54 and 56 and produces first distortion signal 32 ($V_{DIFF}$) and second distortion signal 34 ($V_{SUM}$).

The operation of the distortion cancellation circuit shown in FIG. 3 can be explained by examining the transfer functions of amplifiers 46 and 48:

$$V_2 = A_1 V_1 + A_2 V_1^2 + A_3 V_1^3 + A_4 V_1^4 + \ldots$$
$$V_4 = A_1 V_3 + A_2 V_3^2 + A_2 V_3^3 + A_4 V_3^4 + \ldots$$
where
$$V_1 = \frac{V_i}{\sqrt{2}};$$
$$V_3 = -\frac{V_i}{\sqrt{2}};$$

$$V_2 = A_1 \left( \frac{V_i}{\sqrt{2}} \right) + A_2 \left( \frac{V_i}{\sqrt{2}} \right)^2 +$$

$$A_3 \left( \frac{V_i}{\sqrt{2}} \right)^3 + A_4 \left( \frac{V_i}{\sqrt{2}} \right)^4 + \ldots; \text{ and}$$

$$V_4 = -A_1 \left( \frac{V_i}{\sqrt{2}} \right) + A_2 \left( \frac{V_i}{\sqrt{2}} \right)^2 -$$

$$A_3 \left( \frac{V_i}{\sqrt{2}} \right)^3 + A_4 \left( \frac{V_i}{\sqrt{2}} \right)^4 + \ldots$$

First and second distortion signals 32 ($V_{DIFF}$) and 34 ($V_{SUM}$) are combined in hybrid 44 as follows:

$$V_{SUM} = \frac{1}{\sqrt{2}} * (V_2 + V_4)$$

$$= \frac{1}{\sqrt{2}} * [(A_2)V_i^2 + (A_4/2)V_i^4 + \ldots]$$

$$= \left( \frac{A_2}{\sqrt{2}} \right) V_i^2 + \left( \sqrt{2} * \frac{A_4}{2} \right) V_i^4 + \ldots$$

$$V_{DIFF} = \frac{1}{\sqrt{2}} * (V_2 - V_4)$$

$$= \frac{1}{\sqrt{2}} * \left[ \left( 2\frac{A_1}{\sqrt{2}} \right) V_i + \left( \frac{A_3}{\sqrt{2}} \right) V_i^3 + \ldots \right]$$

$$= A_1 V_i + \left( \frac{A_3}{2} \right) V_i^3 + \ldots$$

From the equations shown above it can be seen that first distortion signal 32 ($V_{DIFF}$) consists of the fundamental and odd-order distortion components of input signal 30, and second distortion signal 34 ($V_{SUM}$) consists only of even-order distortion components of input signal 30.

Figure 4:
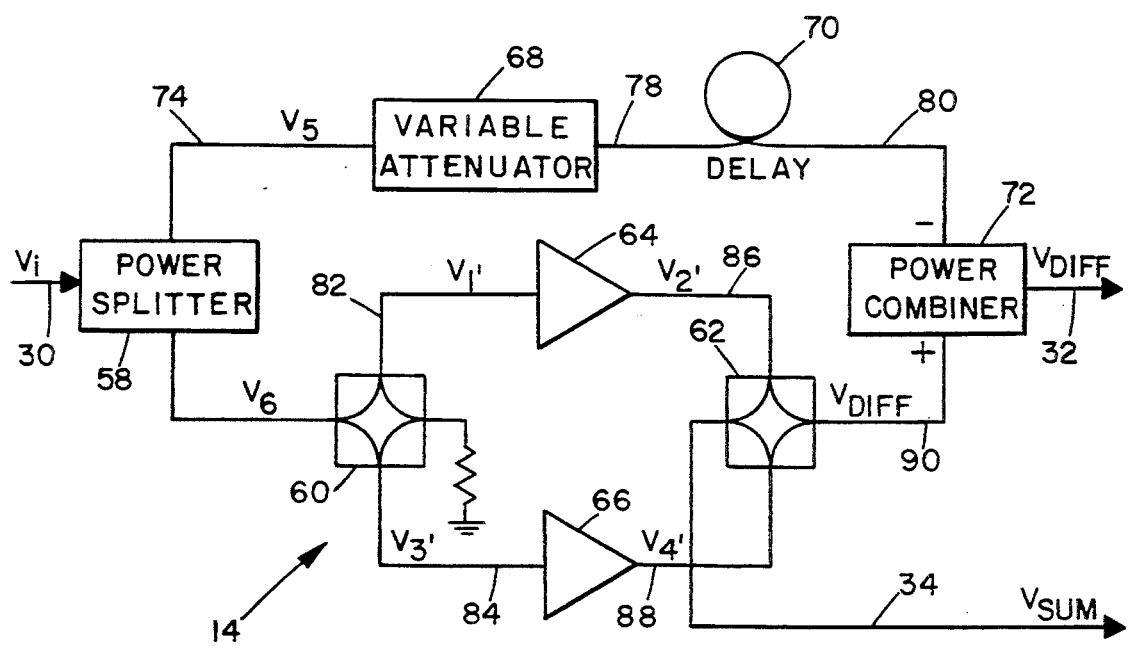
FIG. 4 is a diagrammatic illustration of another embodiment of the odd/even-order distortion generator.

As illustrated in FIG. 4, another embodiment of odd-/even distortion generator 14 may comprise a power splitter 58, two 180 degree hybrid splitter/combiners 60 and 62, two non-linear amplifiers 64 and 66, a variable attenuator 68, a time delay 70, and a 180 degree power combiner 72. Splitter 58 and combiner 72 may be either directional couplers or even-split summer/combiners. This embodiment is particularly useful where distortion cancellation would be enhanced by increasing the level of odd-order distortion components in first distortion signal 32 ($V_{DIFF}$). If the level of signal 32 is increased using the distortion generator circuit shown in FIG. 3, the level of the fundamental component of signal 32 will increase along with the level of the odd-order distortion components. The distortion generator circuit shown in FIG. 4 may be used to increase the level of odd-order distortion components without increasing the level of the fundamental component.

Splitter 58 splits input signal 30 ($V_i$) into a first input signal 74 ($V_5$) and a second input signal 76 ($V_6$) having the same phase. Variable attenuator 68 adjusts the level of first split input signal 74, and time delay 70 delays the attenuated signal 78 to produce a delayed signal 80. The remainder of the circuit is similar to that described above with respect to FIG. 3. Hybrid 60 splits second input signal 76 into a first split signal 82 ($V_1'$) and a second split signal 84 ($V_2'$). Signals 82 and 84 have the same amplitude but differ in phase by 180 degrees. Amplifier 64 receives split signal 82, and amplifier 66 receives split signal 84. Amplifier 64 produces a first amplified signal 86 ($V_3'$), and amplifier 66 produces a second amplified signal 88 ($V_4'$). Signals 86 and 88 consist of the amplified fundamental signals and both even and odd-order distortion components, which are caused by the nonlinearities inherent in amplifiers 64 and 66. Hybrid 62 receives signals 86 and 88 and produces a first distortion signal 90 ($V_{DIFF}'$) and second distortion signal 34 ($V_{SUM}$). Combiner 72 subtracts signal 80 from signal 90 and produces first distortion signal 32 ($V_{DIFF}$).

Figure 5:
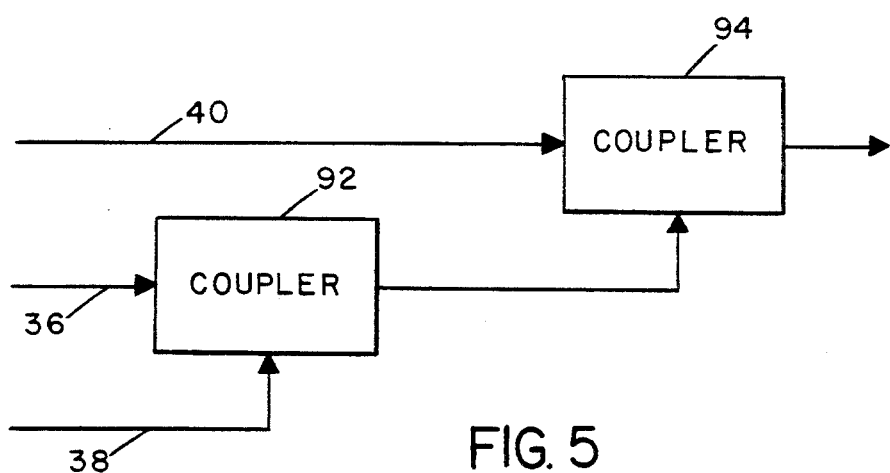
FIG. 5 is a diagrammatic illustration of a suitable three-way power combiner.

To cancel distortion produced by device 12, three-way combiner 20 must either add or subtract equalized first and second distortion signals 36 and 38 at a phasing that causes suppression of both the odd and even distortions. Combiner 20 may be formed as shown in FIG. 5. A first directional coupler 92 combines first and second distortion signals 36 and 38. A second directional coupler 94 combines signal 40 with the output of coupler 92. Depending on the orientation of the terminals of couplers 92 and 94, each coupler combines its input signals either in our out of phase, as known in the art. A time delay (not shown) may be used in series with the input to coupler 94 carrying signal 40 in order to equalize delays.

To adjust the distortion cancellation circuit shown in FIG. 2 for linearization of a given non-linear device 12, the device must first be characterized. A nonlinear device 12 has a series expansion:

$$V_O = A_1 V_i + A_2 V^2_i + A_3 V^3_i + A_4 V^4_i + \ldots$$

where Vo is the output of device 12 and $v_i$ is the input to device 12, $A_j$ is the $j^{th}$-order gain coefficient for the device. The gain coefficients may be negative or positive depending on the inherent nonlinearity of device 12. When a coefficient is negative it has a compressive effect upon $V_o$, and when it is positive it has an expansive effect. For example, when $A_1$, $A_3$, $A_5$, etc. are all negative, the device has compressive odd-order distortions and, when $A_2$, $A_4$, $A_6$, etc. are all positive, the device has expansive even-order distortions.

Some non-linear devices 12 are known to produce compressive distortions and other devices 12 are known to produce expansive distortions. For example, a Mach-Zehnder interferometer, which is commonly used for modulating an optical beam, is known to always produce compressive third-order distortions. On the other hand, some devices can only be determined to be compressive or expansive using empirical methods. For example, a semiconductor laser may have either compressive or expansive distortion characteristics for both odd and even-order distortions.

To cancel expansive distortions, signals 36 and 38 should be subtracted from delayed signal 40. To cancel compressive distortions, these signals should be added to delayed signal 40. This phase relation must be correct in order for equalized distortion signals 36 and 38 to be exactly opposite in phase with the signals generated by device 12. For example, to cancel third-order distortion produced in a Mach-Zehnder interferometer, $A_3$ in first distortion signal 32 ($V_{DIFF}$) must be added to delayed signal 40.

Figure 6:
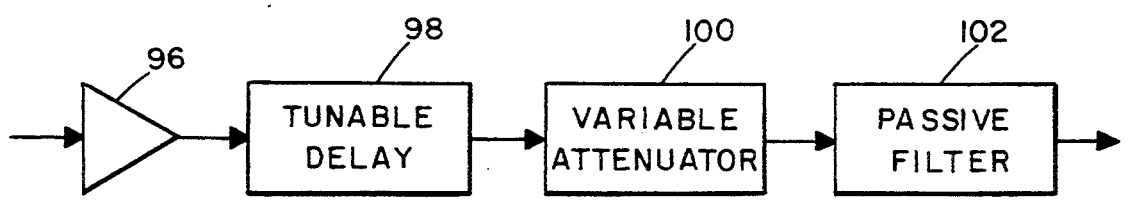
FIG. 6 is a diagrammatic illustration of a suitable equalizer.

If the distortion characteristics of device 12 are not known, any initial phasing may be selected for the inputs of combiner 20. While observing the input and output signals of the combinations shown in FIG. 1a or 1b, the amplitudes of signals 36 and 38 are adjusted using equalizers 22 and 24 to determine if the output signal is distorted with respect to the input signal over the frequency range of interest. As shown in FIG. 6, each of equalizers 22 and 24 may comprise an amplifier 96, a tunable delay 98, a variable attenuator 100, and a passive filter 102. If adjusting attenuator 100 in either of equalizers 22 or 24 reduces distortion, the phasing of combiner 20 is correct. If adjusting attenuator 100 increases distortion, a different phasing should be selected and the process of adjusting equalizers 22 and 24 repeated. After the correct phasing of combiner 20 is determined, the relative phasing of signals 32 and 34 may be adjusted using tunable delay 98 in equalizers 22 and 24 in a manner that further reduces distortion. Filter 102 may be used to add any amplitude equalization necessary to match the amplitude of the generated distortion to that of device 12.

The distortion generators shown in FIGS. 3 and 4 may be used in any suitable distortion cancellation circuit, of which circuit 10 is only illustrative. Obviously, other embodiments and modifications of the present invention will occur readily to those of ordinary skill in the art in view of these teachings. Therefore, this invention is to be limited only by the following claims, which include all such other embodiments and modifications when viewed in conjunction with the above specification and accompanying drawings.

We claim:

1. A circuit for cancelling distortion produced by an electronic device, comprising:
cancellation circuit splitter means for receiving an input signal and for splitting said input signal into first and second signals;
a distortion generator for receiving said first signal and for providing a third signal having a fundamental component and odd-order distortion components and for providing a fourth signal having even-order distortion components; wherein said distortion generator comprises:
distortion generator splitter means for receiving said first signal and for providing a fifth signal and a sixth signal, said fifth and sixth signals having phases 180 apart;
a first amplifier having a nonlinear transfer function for receiving said fifth signal and for producing a seventh signal;
a second amplifier having a nonlinear transfer function for receiving said sixth signal and for producing an eighth signal; and
distortion generator combiner means for receiving said seventh and eighth signals and for producing said third signal and said fourth signal, said third signal being equal to the sum of said seventh and eighth signals, and said fourth signal being equal to the difference between said seventh and eighth signals;
delay means for receiving said second signal and for providing a delayed second signal; and
cancellation circuit combiner means for producing a combined signal in response to said delayed second signal, said third signal, and said fourth signal.

2. The circuit recited in claim 1, further comprising first equalizer means between said distortion generator and said distortion generator combiner means for adjusting at least one characteristic of said sum signal.

3. The circuit recited in claim 2, further comprising second equalizer means between said distortion generator and said distortion generator combiner means for adjusting at least one characteristic of said difference signal.

4. The circuit recited in claim 3, wherein:

said third and fourth signals are added to said second delayed signal when said distortion is compressive; and said third and fourth signals are subtracted from said second delayed signal when said distortion is expansive.

5. A circuit for cancelling distortion produced by an electronic device comprising:

cancellation circuit splitter means for receiving an input signal and for splitting said input signal into first and second signals;

a distortion generator for receiving said first signal and for providing a third signal having a fundamental component and odd-order distortion components and for providing a fourth signal having even-order distortion components; wherein said distortion generator comprises:

first distortion generator splitter means for receiving said first signal and for providing fifth and sixth signals having the same phase;

second distortion generator splitter means for receiving said sixth signal and for providing seventh and eighth signals having phases 180 degrees apart;

a first amplifier having a nonlinear transfer function for receiving said seventh signal and for producing a ninth signal;

a second amplifier having a nonlinear transfer function for receiving said eighth signal and for producing a tenth signal; and second distortion generator combiner means for receiving said ninth and tenth signals and for producing said fourth signal and an intermediate signal, said fourth signal being representative of the sum of said ninth, and tenth signals and said intermediate signal representative of the difference between said ninth and tenth signals;

delay means for receiving said fifth signal and for providing a delayed fifth signal; and first distortion generator combiner means for receiving said delayed fifth signal and said intermediate signal and for producing said third signal, said third signal being representative of the difference between said intermediate signal and said delayed fifth signal;

delay means for receiving said second signal and for providing a delayed second signal; and cancellation circuit combiner means for producing a combined signal in response to said delayed second signal, said third signal, and said fourth signal.

6. The circuit recited in claim 5, further comprising a variable attenuator for attenuating said fifth signal.

* * * * *